US 6,548,890 B2

(12) United States Patent
Miyake et al.

(10) Patent No.: US 6,548,890 B2
(45) Date of Patent: Apr. 15, 2003

(54) PRESS-CONTACT TYPE SEMICONDUCTOR DEVICE

(75) Inventors: Eitaro Miyake, Hino (JP); Yoshiki Endo, Ichikawa (JP); Ichiro Omura, Yokohama (JP); Tomokazu Domon, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/051,001

(22) Filed: Jan. 22, 2002

(65) Prior Publication Data

US 2002/0154482 A1 Oct. 24, 2002

(30) Foreign Application Priority Data

Jan. 23, 2001 (JP) .................................. P2001-15044

(51) Int. Cl.[7] .............................................. H01L 23/48
(52) U.S. Cl. ........................ 257/688; 257/726; 257/727
(58) Field of Search ................................ 257/688, 727, 257/723, 724, 726

(56) References Cited

U.S. PATENT DOCUMENTS

| 4,996,586 | A | * | 2/1991 | Matasuda et al. |
| 5,610,439 | A | * | 3/1997 | Hiyoshi et al. |
| 5,708,299 | A | * | 1/1998 | Teramae et al. |
| 6,281,569 | B1 | * | 8/2001 | Sugiyama |
| 6,297,549 | B1 | * | 10/2001 | Hiyoshi |

FOREIGN PATENT DOCUMENTS

| EP | 0 923 127 A2 | 6/1999 |
| JP | 2001-102520 | 4/2001 |

OTHER PUBLICATIONS

Omura et al.; "Semiconductor Device, Drive Method, and Drive Apparatus"; U.S. patent application No. 09/312,718, filed May 17, 1999.

Miyake et al.; "Pressure—Contact Type Semiconductor Device"; U.S. patent application No. 09/774,610, filed Feb. 1, 2001.

* cited by examiner

Primary Examiner—Sheila V. Clark
(74) Attorney, Agent, or Firm—Finnegan, Henderson, Farabow, Garrett & Dunner, L.L.P.

(57) ABSTRACT

A press-contact type semiconductor device comprises: a plurality of semiconductor elements each of which has a first main electrode and a control electrode and a second main electrode; a second common main power source plate having the semiconductor elements positioned on a front surface thereof and electrically connected to the second main electrodes; a first common main power source plate arranged on the front surfaces of the semiconductor elements and electrically connected to the first main electrodes; a common control signal/main current plate arranged between semiconductor elements and including at least control signal wiring layers and main current wiring layers; conductive connectors for electrically connecting at least the main current wiring layers and the first common maim power source plate; and conductive elastic members for electrically connecting the main current wiring layers or the first common main power source plate to the conductive connectors by elasticity.

20 Claims, 8 Drawing Sheets

PRIOR ART

PRESS-CONTACT TYPE SEMICONDUCTOR DEVICE

CROSS REFERENCE TO RELATED APPLICATION

This application is based upon and claims the benefit of priority from the prior Japanese Patent Application No. P2001-15044, filed on Jan. 23, 2001, the entire contents of which are incorporated herein by reference.

BACKGROUND OF THE INVENTION

1. Field of the Invention

This invention relates to a press-contact type semiconductor device, and particularly to a press-contact type semiconductor device of a multiple chip module structure having a plurality of semiconductor elements. Further, the invention relates to a technique which is applicable to press-contact type semiconductor devices used to control vehicle motors in the traction applications and power sources.

2. Description of the Related Art

Referring to FIG. 12 of the accompanying drawings, a press-contact type semiconductor device 100 of the related art comprises semiconductor elements 103A and 103B which are sandwiched in a pressed state between a common emitter power source plate (a lower electrode post) 101 and a common collector power source plate (a upper electrode post) 105. The semiconductor elements 103A and 103B are power switching elements such as insulated gate bipolar transistors (IGBT). The semiconductor element 103A has an emitter electrode 131 and a gate electrode 132 on its front surface, and a collector electrode 133 on its rear surface. The same holds true to the semiconductor element 103B. The semiconductor elements 103A and 103B are mounted in the face-down state. In FIG. 12, the emitter electrodes 131 and gate electrodes 132 are under the semiconductor elements 103A and 103B while the collector electrodes 133 are on the semiconductor elements 103A and 103B. In each of the semiconductor elements 103A and 103B, the emitter electrode 131, gate electrode 132 and collector electrode 133 are electrically connected in parallel.

The common emitter power source plate 101 and common collector power source plate 105 are mainly made of copper, a copper alloy or the like which has excellent electric conductivity and thermal conductivity. The semiconductor elements 103A and 103B are made of silicon. A thermal buffer 102 is provided between the common emitter power source plate 101 and the semiconductor elements 103A and 103B considering a difference of thermal expansion coefficients of these materials. Further, another thermal buffer 104 is provided between the common collector power source plate 105 and the semiconductor elements 103A and 103B.

A side cover 106 extends around the common emitter power source plate 101, semiconductor elements 103A and 103B and common collector power source plate 105, and are ceramics insulators or the like in order to avoid electric short-circuiting between the common emitter power source plate 101 and common collector power source plate 105.

With this press-contact type semiconductor device 100, a switching voltage V is supplied to the gate electrodes 132 of the semiconductor elements 103A and 103B from an external power source 110 in order to intermittently introduce a current I to the common emitter power source plate 101 from the common collector power source plate 105.

In the semiconductor device 100, a reference potential of the switching voltage V is an emitter potential. In other words, an external terminal 101P of the common emitter power source plate 101 is connected to a reference potential terminal of the external power source 110, and a circuit operating potential terminal is connected to a gate terminal 132P for supplying the switching voltage V to the gate electrode 132. See FIG. 12. As a result, inductances Ls1 to Ls4 and Lg1 to Lg3 are generated in circuits between the gate electrodes 132 and emitter electrodes 131 of the semiconductor elements 103A and 103B.

The inductances Ls1 and Ls2 apply an induction voltage to the switching voltage V in response to a variation dI/dt of the current I, which causes mal-operations (error operations) of the semiconductor elements 103A and 103B. Further, the inductance Ls1 and Ls2 result in current concentration. The inductances Ls2, Ls3 and Lg1 delay timings for switching on or off the semiconductor elements 103A and 103B, which will lead to power loss. Still further, the semiconductor elements 103A and 103B may operate at varying timings. The inductances Lg2 and Lg3 may cause oscillations between the semiconductor elements 103A and 103B, and vibrate the current I. The inductances Lg2 and Lg3 cause current concentration.

BRIEF SUMMARY OF THE INVENTION

According to the embodiment of the invention, there is provided a press-contact type semiconductor device comprising at least: a plurality of semiconductor elements each of which has a first main electrode and a control electrode on a front surface thereof and a second main electrode on a rear surface thereof; a second common main power source plate having the semiconductor elements positioned on a front surface thereof and electrically connected to the second main electrodes; a first common main power source plate arranged on the front surface of the semiconductor elements and electrically connected to the first main electrodes of the semiconductor elements; a common control signal/main current plate arranged between the semiconductor elements and having at least a common control signal wiring layer electrically connected to the control electrodes and a main current wiring layer electrically connected to the first main electrodes; a conductive connector electrically for connecting at least the main current wiring layer and the first common maim power source plate; and a conductive elastic member configured to connect electrically the main current wiring layer or the first common main power source plate to the conductive connector by elasticity.

DETAILED DESCRIPTION OF THE INVENTION

Figure 1:
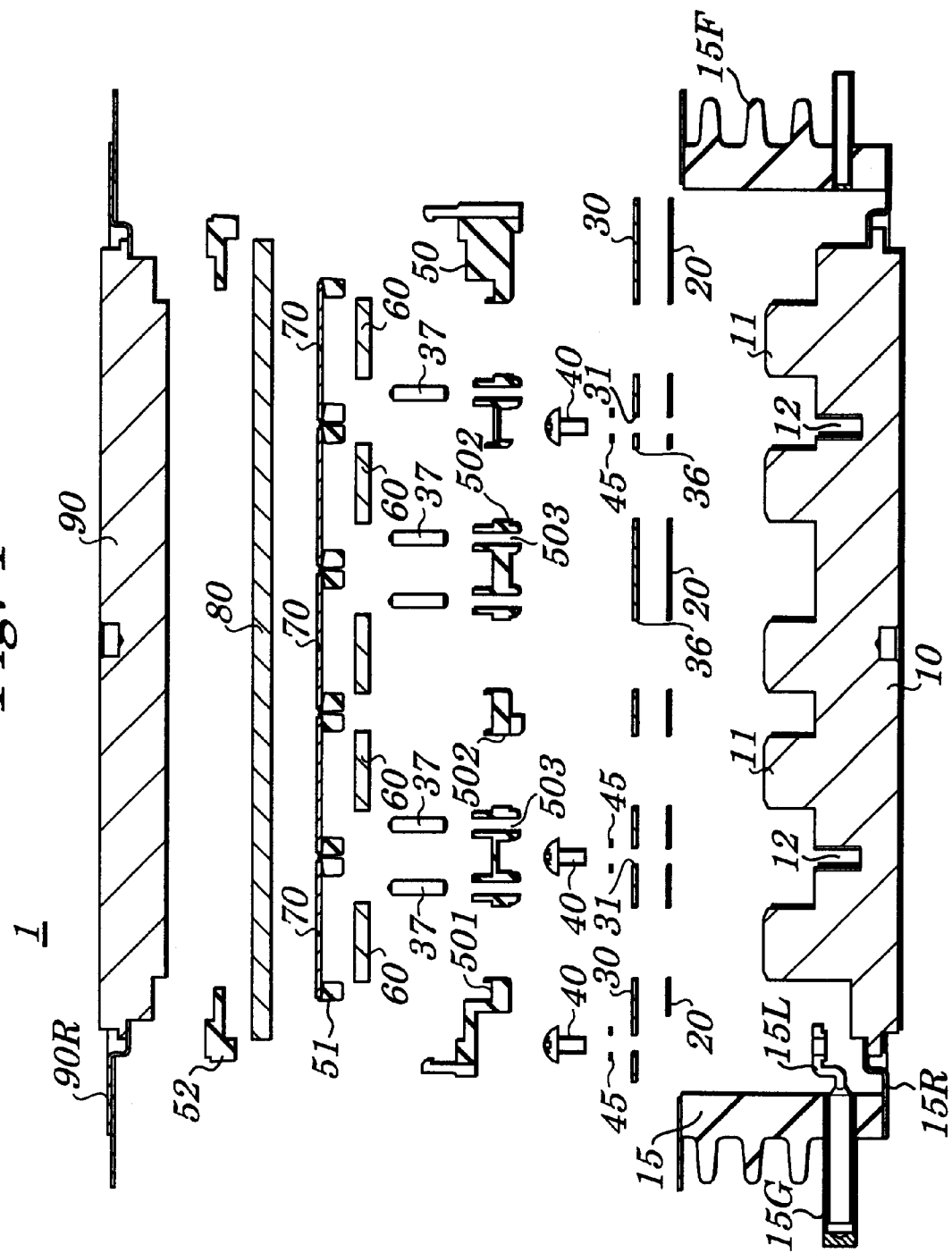
FIG. 1 is an exploded cross section of a press-contact type semiconductor device according to a first embodiment of the invention.

The invention will be described with reference to embodiments shown in the drawings. Throughout the drawings, like or corresponding parts are assigned by like or corresponding reference numerals. However, it should be noted that the drawings are schematic, and that dimensions shown in the drawings are not always equal to those of actual parts or devices.

Figure 2:
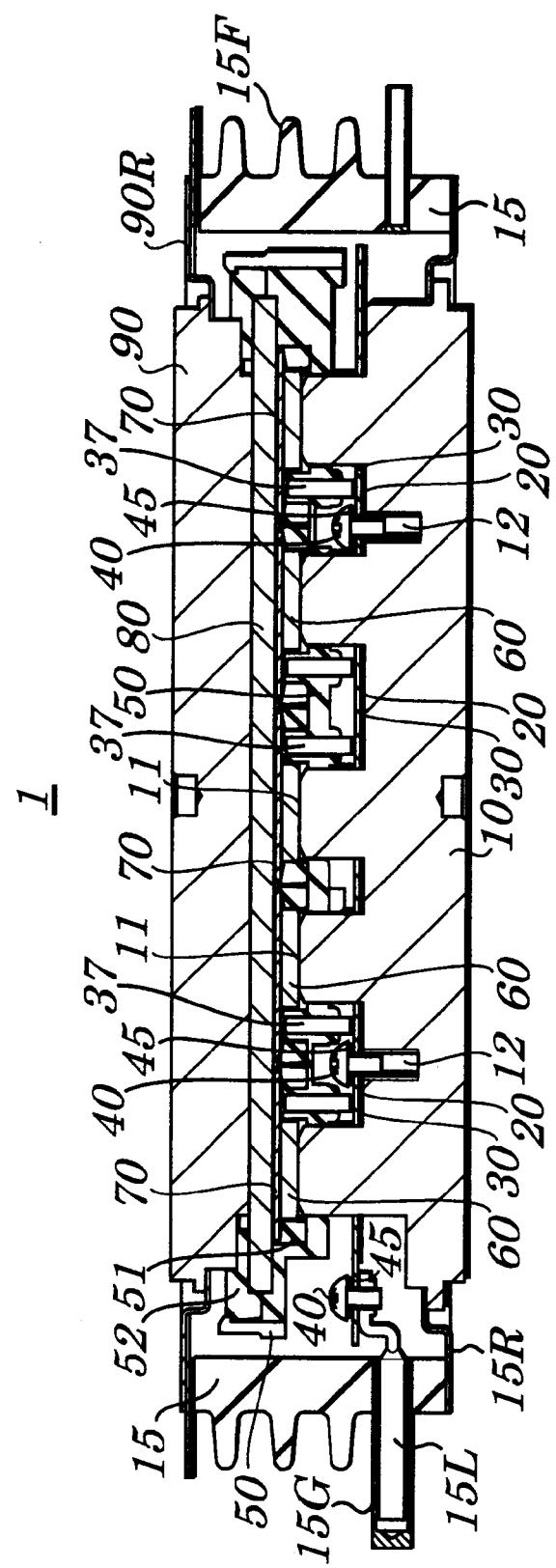
FIG. 2 is a cross section of the press-contact type semiconductor device according to the first embodiment.
Figure 3:
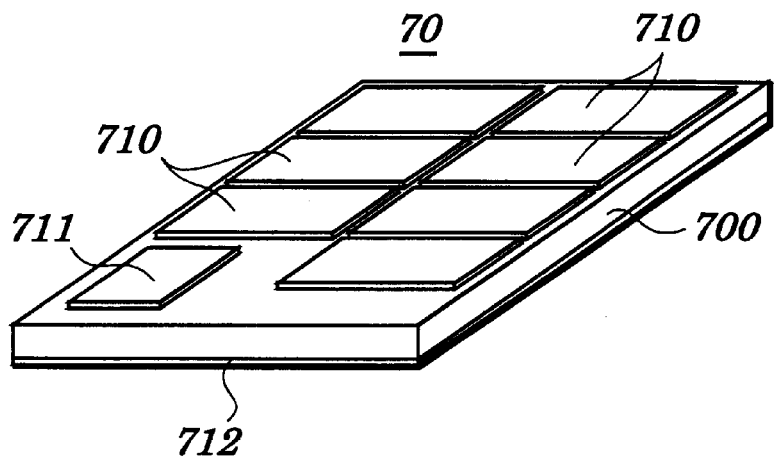
FIG. 3 is a perspective view of a semiconductor element arranged in the press-contact type semiconductor device according to the first embodiment.

First Embodiment of the Invention
Overall Configuration of Press-Contact Type Semiconductor Device Referring to FIG. 1 to FIG. 3, the press-contact type semiconductor device 1 comprises: a plurality of semiconductor elements 70, each of which includes a first main electrode 710 and a control electrode 711 on a front surface and a second main electrode 712 on a rear surface; a second main power source plate (collector press-contact electrode plate) 90 having the semiconductor elements 70 on a front surface and electrically connected to the second main electrodes 712; a first common main power source plate (emitter press-contact electrode plate) 10 arranged over the front surfaces of the semiconductor elements 70 and electrically connected to the first main electrodes 710; a common control signal/main current plate 30 which includes at least not only control signal wiring layers 321 and 323 (shown in FIG. 5) electrically connected to the control electrodes 711 but also main current wiring layers 320, 322 and 324 electrically connected to the first main electrode 710; conductive connectors 40 for electrically connecting at least the main current wiring layers 320, 322 and 324 to the first common main power source plate 10; and conductive elastic members 45 for electrically connecting the main current wiring layers 320, 322 and 324 to the conductive connector 40 by elasticity.

Each semiconductor element 70 has the first main electrode 710 and control electrode 711 positioned on its front surface (at an upper part in FIG. 3), and the second main electrode 712 on its rear surface (at the lower part in FIG. 3). The semiconductor elements 70 are assembled in the press-contact type semiconductor device 1 in the face-down state. In other words, the first common main power source plate 10 (shown at the lower part in FIG. 1 and FIG. 2) is positioned on the front surface of the semiconductor elements 70 while the second common main power source plate 90 (shown at the upper part in FIG. 1 and FIG. 2) is positioned on the rear surface of the semiconductor elements 70.

The press-contact type semiconductor device 1 further comprises at least a side cover 15, a first chip frame 50, a plurality of first thermal buffer plates 60, a second chip frame 51, a second thermal buffer plate 80, and a thermal buffer plate support 52.

Structure of Semiconductor Elements (IGBT)

Figure 4:
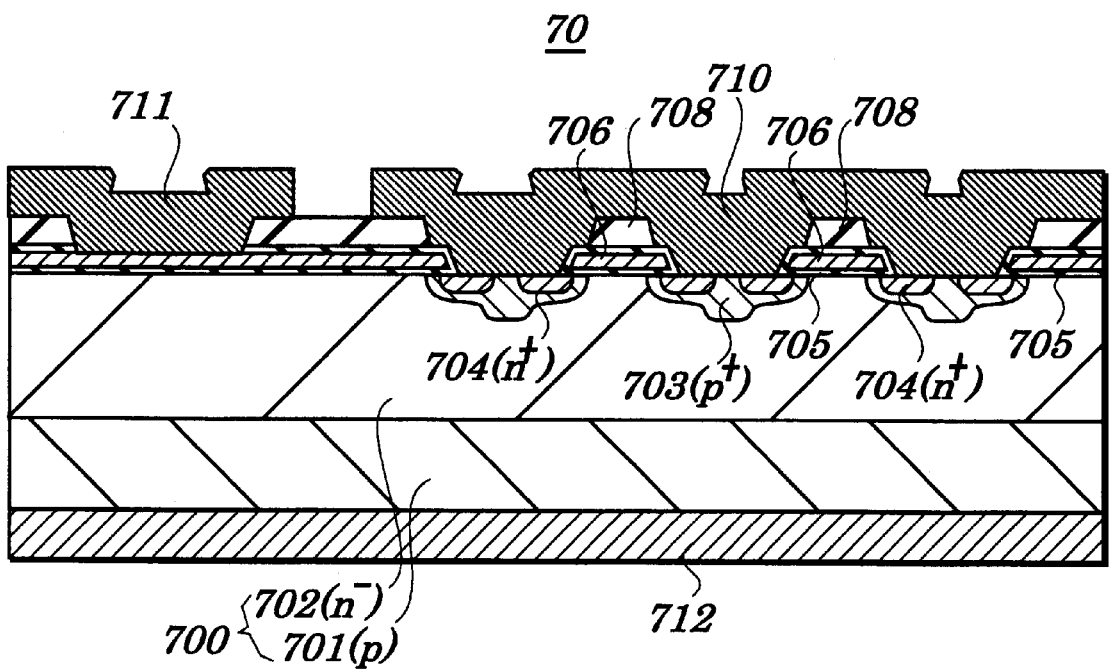
FIG. 4 is an enlarged cross section of the essential parts of the semiconductor element according to the first embodiment.

As shown in FIG. 3 and FIG. 4, the semiconductor elements 70 are IGBTs which are reliably resistant to voltage breakdown, have a large capacity, and enable high speed switching operations. In each semiconductor element 70, the IGBT is mounted on a silicon single crystal substrate (a silicon single crystal chip) 700.

The IGBT comprises at least: an n-type emitter region 704 serving as a first main electrode region and having a high impurity density; a p-type collector region 701 serving as a second main electrode region and having a low impurity density; a gate electrode 706 serving as a control electrode region; a p-type base region 703 having a high impurity density; and an n-type base region 702 having a low impurity density.

The silicon single crystal substrate 700 has the p-type collector region 701 positioned on its rear surface and the n-type base region 702 on its front surface. The n-type base region 702 may have a high impurity density. The p-type base region 703 is positioned on the main surface of the n-type base region 702 while the n-type emitter region 704 is on the main surface of the p-type base region 703. The gate electrode 706 is formed on a front surface of the silicon single crystal substrate 700 via a gate insulating film 705, and is made of a silicon polycrystalline film doped with impurities in order to adjust a resistance value, for example. The gate insulating film 705 is made of a silicon oxide film, a silicon nitride film or the like. The IGBT comprises a plurality of minute IGBT cells which are arranged in the shape of a matrix and are electrically connected in parallel.

In the IGBT, a first main electrode (emitter electrode) 710 is electrically connected to the n-type emitter region 704. The gate electrode 706 is electrically connected to the control electrode 711. The second main electrode (collector or rear electrode) 712 is electrically connected to the p-type collector region 701. The first main electrode 710 and control electrode 711 are made of the same conductive materials, are positioned on the silicon single crystal substrate 700 via an inter-layer insulating film 708, and are flush with each other. Specifically, the first main electrode 710 and control electrode 711 are made of conductive films such as aluminum (Al) films, aluminum alloy films (Al—Si film, Al—Cu films or Al—Cu—Si films and so on) or the like. The second main electrode 712 extends substantially all over the rear surface of the silicon single crystal substrate 700, and is made of a conductive film such as an aluminum film, an aluminum alloy film, or the like.

In this embodiment, the press-contact type semiconductor device 1 comprises only one kind of semiconductor elements 70. Alternatively, another kind of semiconductor elements may be provided together with the semiconductor elements 70 and be flush with one another. For instance, free wheel diodes (FWD) may be used for this purpose. These semiconductor elements are provided with main electrodes, e.g. cathode electrodes and anode electrodes, on front and rear surfaces thereof.

Structure of First Common Main Power Source Plate

As shown in FIG. 1 and FIG. 2, the first common maim power source plate 10 is in the shape of a disc although not shown in drawings, serves for all of the semiconductor elements 70, and radiates heat produced because of the circuit operation of the semiconductor elements 70.

The first common maim power source plate 10 comprises projection electrodes 11 on its front surface (facing the front surface of the semiconductor elements 70). The projection electrodes 11 are provided for the respective semiconductor elements 70, are in pressure contact with first main electrodes 710 of the semiconductor elements 70 via first thermal buffers 60, and are electrically connected to the first main electrodes 710. The projection electrodes 11 are substantially square similarly to the semiconductor elements 70 (and the first main electrodes 710), and have recesses for receiving control electrodes 711.

The first common main power source plate 10 is made of a metallic material having good thermal conductivity such as a copper (Cu) plate, a copper alloy plate or the like, and includes the projection electrodes 11 as integral parts. The first common main power source plate 10 itself is preferably prepared by cutting.

Structure of Side Cover

As shown in FIG. 1 and FIG. 2, a cylindrical side cover 15 extends around the first common main power source plate 10 via an annular metal frame 15R. The cylindrical side cover 15 has creases 15F on its outer surface in order to increase a length between the first common maim power source plate 10 and the second common main power source plate 90, block a current flowing between these first and second common main power source plates 10 and 90 (in order to prevent short-circuit), and improve insulation resistance.

The first common main power source plate 10 is positioned at the bottom of the side cover 15 while the second common main power source plate 90 is at the top of the side cover 15, as shown in FIG. 1 and FIG. 2. The side cover 15 is made of mechanically strong and insulating ceramics or the like, for example. Further, the side cover 15 has a gate terminal 15G for supplying a control signal (a gate voltage or a switching voltage) to the control electrodes 711 of the semiconductor elements 70.

Structure of Common Control Signal/Main Current Plate

Figure 5:
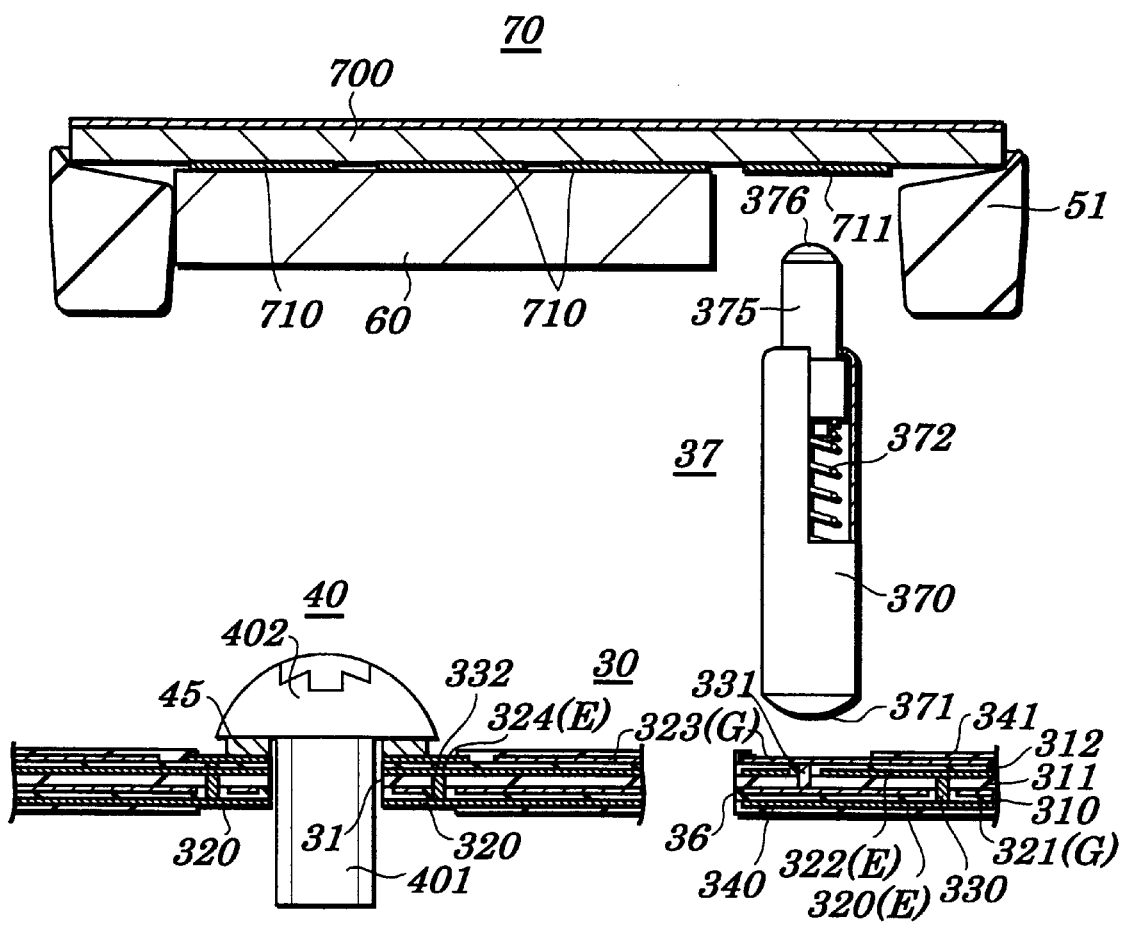
FIG. 5 is an enlarged cross section of parts of the semiconductor element, a control electrode probe and a common control signal/main current plate according to the first embodiment.

As shown in FIG. 1, FIG. 2 and FIG. 5, the common control signal/main current plate 30 produces a potential which is substantially equal to a potential of the first main electrodes 710. This potential is used as a reference potential (a switching voltage or a gate voltage) to be supplied to the control electrodes 711 of the semiconductor elements 70. The common control signal/main current plate 30 is constituted by a multi-layered wiring substrate or preferably a printed circuit board having multi-layered wiring structure, in which a main current wiring layer 320, an insulating layer 310, a control signal wiring layer 321, an insulating layer 311, a main current wiring layer 322, an insulating layer 312, and a control signal wiring layer 323 (and a main current wiring layer 324) are laid over one after another.

The insulating layers 310, 311 and 312 are preferably made of a glass epoxy resin, for example. Alternatively, the insulating layer 311 may be made of the glass epoxy resin while the insulating layers 310 and 312 may be made of silicon oxide films, silicon nitride films or the like. The main current wiring layer 320, control signal wiring layer 321, main current wiring layer 322, control wiring layer 323 and main current wiring layer 324 are preferably made of very electrically conductive and thermally conductive metal films such as thin copper films, thin copper alloy films and so on. The lowermost main current wiring layer 320, uppermost control signal wiring layer 323 and uppermost main current wiring layer 324 are preferably covered by thin nickel (Ni) films or the like in order to assure protection against oxidation. The common control signal/main current plate 30 is thick, i.e. the main current wiring layers 320 and 322, and control signal wiring layers 321 and 323 are 60 $\mu$m to 80 $\mu$m thick, respectively. However, the layers 320, 321, 322 and 323 may have different values of thickness.

The main current wiring layers 320 and 322 are electrically connected using a through-hole wiring 330 formed in the insulating layers 310 and 311. The main current wiring layers 322 and 324 are electrically connected using a through-hole wiring 332 formed in the insulating layer 312. The control signal wiring layers 321 and 323 are electrically connected using a through-hole wiring 331 formed in the insulating layers 311 and 312. The through-hole wirings 330, 331 and 332 are preferably made of conductive materials such as copper or a copper alloy.

A solder-resist film 340 covers the main current wiring layer 320 and also extends over the insulating layer 310 in order to prevent electric shorting between the main current wiring layer 320 and with other conductors. Further, a solder-resist film 341 is provided on the uppermost insulating layer 312 in order to cover the control signal wiring layer 323 and main current wiring layer 324.

The common control signal/main current plate 30 has electrode holes 36 corresponding to the respective semiconductor elements 70, and is in the shape of a flat mesh. Each electrode hole 36 is slightly larger than each projection electrode 11, and is shaped similarly to the projection electrode 11.

The main current wiring layers 320, 322 and 324 and the control signal wiring layers 321 and 323 are usually formed by the sputtering or laminating process. However, it is very difficult to make each of these layers thick enough. In the first embodiment, the main current wiring layers 320, 322 and 324 are electrically connected to one another using the through-hole wirings 330 and 332 in order to increase the thickness (sectional area) of the main current route. Further, the control signal wiring layers 321 and 323 are electrically connected using the through-hole wiring 331 in order to increase the thickness of the control signal route.

The main current wiring layers 320 and 322 are positioned opposite to the control signal wiring layer 321, i.e. the main current wiring layer 322 is parallel to the control signal wiring layer 321. This increases a mutual inductance, and reduces a circuit inductance between the first main electrode 710 and the control electrode 711.

The main current wiring layers 320, 322 and 324 and the control signal wiring layers 321 and 323 are arranged between the semiconductor elements 70 with spaces maintained therebetween (in order to prevent short-circuiting), thereby increasing the sectional areas of the main current route and the control signal route. In the press-contact type semiconductor device 1, the first and second common main power source plates 10 and 90 are disposed with the semiconductor elements 70 sandwiched therebetween, so that there is no space for an electrode plate (e.g. control electrode plate or main electrode plate) on either the front or rear surfaces of the semiconductor elements 70. Therefore, the common control signal/main current plate 30 is designed to increase the sectional areas of the main current route and control signal route using free spaces between the semiconductor elements 70.

The common control signal/main current plate 30 is preferably approximately 0.4 mm to 0.6 mm thick. Alternatively, the common control signal/main current plate 30 carrying a resistance element or the like thereon may be 1.5 mm or less thick as a whole.

Although not shown, the common control signal/main current plate 30 may constitute a resistance element using the main current wiring layer 320, 322 or 324, or the control signal wiring layer 321 or 323, or preferably the main current wiring layer 320 or the control signal wiring layer 323. The resistance element may be integral with the main current wiring layer 320 or 324, or the control signal wiring layer 323 (only by modifying a flat pattern).

Structure of Conductor Connectors and Conductive Elastic Members

Figure 6:
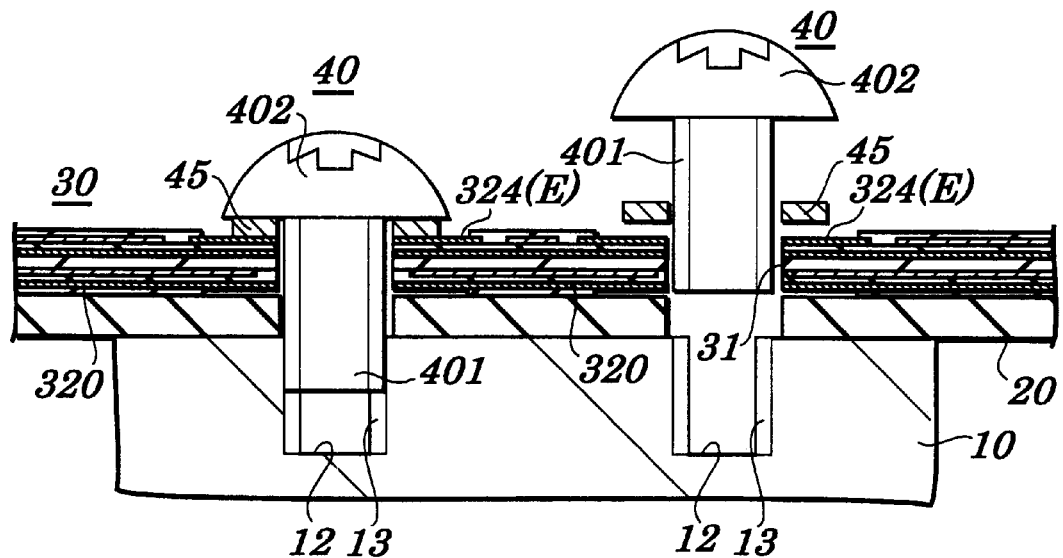
FIG. 6 is an enlarged cross section of a conductive connector and a conductive elastic member of the press-contact type semiconductor device according to the first embodiment.

Referring to FIG. 1, FIG. 2 and FIG. 6, the conductive connectors 40 are screws for attaching the common control signal/main current plate 30 to the first common main power source plate 10. The conductive elastic members 45 are washers, coned disc springs or the like which are inserted between the conductive connectors 40 and the common control signal/main current plate 30. In this embodiment, the conductive elastic members 45 are the washers.

Several holes 12 are formed on the front surface of the first common main power source plate 10, and are provided with female threads on inner surfaces thereof. Each conductive connector 40 has a male thread at one end thereof (at the lower part shown in FIG. 6), and is electrically connected to the main current wiring layer 324 at the other end thereof via the conductive elastic member 45. The conductive connector 40 also has a head 402 in order to mechanically support the common control signal/main current plate 30 (on the first common main power source plate 10). The conductive connector 40 is preferably at least a small metal screw, a metal bolt or the like made of a conductive material such as iron (Fe), an iron-nickel (Fe—Ni) alloy, stainless steel (e.g. Fe—Ni—Cr), copper or a copper alloy.

The conductive elastic member 45 is flat and annular, enables the male thread 401 of the conductive connector 40 to pass therethrough, and comes into contact with the head 402 of the conductive connector 40. The conductive elastic member 45 is preferably a metal washer, for example.

As shown in FIG. 2, the common control signal/main current plate 30 can be easily and reliably mounted on the first common main power source plate 10. Specifically, the conductive connectors 40 are fitted into the holes 12 of the first common main power source plate 10 via holes 31 of the common control signal/main current plate 30. In this state, the male threads 401 of the conductive connectors 40 are engaged with the female threads of the holes 12 of the first common main power source plate 10. Further, the first common main power source plate 10 are electrically connected to the main current wiring layers 320, 322 and 324 of the common control signal/main current plate 30. Further, the conductive elastic members 45 inserted between the conductive connectors 40 and the common control signal/main current plate 30 are effective in electrically connecting the conductive connectors 40 and the main current wiring layer 324 of the common control signal/main current plate 30 in a continuously pressed state. Therefore, the common control signal/main current plate 30 can sufficiently reduce the inductance, and the conductor connectors 40 can be electrically and reliably connected to the main current wiring layer 324.

The conductive connectors 40 and conductive elastic members 45 can function as the main current route (emitter current route), which is effective in reducing the inductance.

Further, the conductive connectors 40 and conductive elastic members 45 electrically connect the main current wiring layer 324 and the first common main power source plate 10 at a plurality of points, which is effective in reducing the inductance.

Referring to FIG. 1 and FIG. 2, the control signal wiring layer 323 is electrically and mechanically connected to a gate lead 15L of the gate terminal 15G using a conductive connector 40 and a conductive elastic member 45, at a part of the periphery of the common control signal/main current plate 30. In other words, the connection between the control signal wiring layer 323 and the gate lead 15L is basically identical to the connection between the main current wiring layer 324 and the first common main power source plate 10, and will not described here in detail.

An insulator 20 is provided between the first common control signal/main current plate 30 and the first common main power source plate 10 in order to electrically insulate them. The insulator 20 is preferably a resin substrate or a resin film made of a glass epoxy resin, a polyimide resin, a silicon resin, a polyetherimido resin or the like.

Structure of Element Supports

As shown in FIG. 1, FIG. 2 and FIG. 5, A first element holder 50 is provided on the common control signal/main current plate 30 in order to support a second element holder 51 carrying the semiconductor elements 70. Both the first and second element holders 50 and 51 are insulating members, and are preferably made of a molded glass epoxy resin, polyimide resin, silicon resin, polyetherimido resin or the like.

The first element holder 50 is constituted at least by a holding section 501 supporting the second element holder 51, an opening 502 for receiving the first thermal buffers 60, and another holding section 503 for holding control electrode probes 37.

Structure of Control Electrode Probes

Referring to FIG. 1, FIG. 2 and FIG. 5, each control electrode probe 37 has its end (lower end in the drawing figures) being in electric contact with the control signal wiring layer 323 of the common control signal/main current plate 30, and the other end (upper end) thereof being in electric contact with the control electrode 711 of each semiconductor element 70. In other words, the control electrode probes 37 electrically connect the control electrodes 711 to the control signal wiring layer 323. There are as many control electrode probes 37 as the semiconductor elements 70. Each probe holding section 503 is an opening having an inner diameter larger than an outer diameter of each control electrode probe 37. Each control electrode probe 37 is fitted into the probe holding section 503, and is attached to the first element holder 50.

As shown in FIG. 5, the control electrode probe 37 comprises: a cylinder 370 at one end thereof; a substrate contacting part 371 at the bottom of the cylinder 370; a elastic member 372 housed in the cylinder 370; a movable piston 375 at the other end; and an element contacting part 376 at an upper end of the piston 375. The substrate contacting part 371 is semi-spherical in order that the control electrode probe 37 comes into uniform contact with the control signal wiring layer 323 of the common control signal/main current plate 30 at a plurality of positions. The element contacting part 376 is also semi-spherical such that the control electrode probe 37 comes into uniform contact with the control electrode 711 of the semiconductor element 70 at a plurality of positions. The elastic member 372 resiliently and axially moves the piston 375 in the cylinder 370, so that the control electrode probe 37 can have uniform contact pressure at each contact point.

The cylinder 370 and piston 376 are preferably made of conductive and mechanically strong metallic material such as copper, copper alloy, iron-nickel alloy. In this case, the cylinder 370 and piston 376 are preferably nickel-plated in order to prevent oxidation. The elastic member 372 may be a coil spring, for example.

Structure of First Thermal Buffers

Referring to FIG. 1, and FIG. 5, the projection electrodes 11 of the first common main power source plate 10 are in pressure contact with the first main electrodes 710 of the semiconductor elements 70 via the first thermal buffers 60, and are electrically connected to the first main electrodes 710. The first thermal buffers 60 are provided for each semiconductor element 70 in order to reduce stress which is caused due to a difference between thermal expansion coefficients of the semiconductor element 70 and the first common main power source plate 10, i.e. particularly the projection electrode 11. In short, the first thermal buffers 60 are in the shape of a chip which is similar to each semiconductor element 70 or each projection electrode 11.

Each first thermal buffer 60 is preferably a molybdenum (Mo) plate which has a thermal expansion coefficient between the thermal coefficient of silicon single crystal (i.e. the semiconductor element 70) and the thermal coefficient of copper (the first common main power source plate 10), is conductive and is 1 mm to 2 mm thick. Alternatively, the first thermal buffer 60 may be a refractory metal plate such as a tungsten (W) plate.

The first thermal buffers 60 also serve as spacers for height adjustment when semiconductor elements carrying free wheel diodes are mounted to be flush with the semiconductor elements 70. For instance, if the semiconductor elements 70 are thin while other semiconductor elements are thick, the former are mounted on thick first thermal buffers 60 while latter are mounted on thin first thermal buffers 60, thereby unifying the overall height.

Structure of Second Thermal Buffer

As shown in FIG. 1 and FIG. 2, the second common main power source plate 90 comes into pressure contact with and are electrically connected to the second main electrodes 712 of the semiconductor elements 70 via a second thermal buffer 80. The second thermal buffer 80 serves for all of the semiconductor elements 70, differs from the first buffers 60 in this respect, and is in the shape of a disc similarly to the first or second common main power source plate 10 or 90.

The second thermal buffer 80 functions identically to the first thermal buffers 60 in order to reduce stress which is caused by the difference between thermal expansion coefficients of the semiconductor elements 70 and the second common main power source plate 90. Therefore, the second thermal buffer 80 has an appropriate thermal expansion coefficient, and is preferably made of a conductive molybdenum plate with thickness of 1 mm to 2 mm.

Further, the second thermal buffer 80 has its periphery supported by a thermal buffer holder 52. Specifically, the second thermal buffer 80 is sandwiched between the first element holder 50 and the second common main power source plate 90 via the thermal buffer holder 52. One end (lower end in FIG. 6) of the thermal buffer holder 52 is provided with a male thread 401 which is engageable with a female thread. The thermal buffer holder 52 is preferably made of a molded resin similarly to the first element holder 50, for example.

In this embodiment, the second thermal buffer 80 is disc-shaped. Alternatively, it may be in the shape of a chip similarly to the semiconductor elements 70 or projection electrodes 11.

Structure of Second Common Main Power Source Plate

Referring to FIG. 1 and FIG. 2, the second common main power source plate 90 is in the shape of a disc similarly to the first common main power source plate 10, and serves for the semiconductor elements 70. The second common main power source plate 90 also radiates heat generated by the operation of the semiconductor elements 70, and has its periphery electrically connected to the second main electrodes 712 of the semiconductor elements 70 via the second thermal buffer 80.

The second common main power source plate 90 is made of a metal material similarly to the first common main power source plate 10, and is preferably prepared by the cutting process, for example.

An annular metal frame 90R is attached around the second common main power source plate 90, so that the second common main power source plate 90 is positioned at the upper part of the side cover 15 via the annular metal frame 90R. The annular metal frame 90R is welded to an annular frame (to which no reference numeral is assigned in FIG. 1 and FIG. 2) provided on the side cover 15.

Features of Semiconductor Device

In the press-contact type semiconductor device 1, the semiconductor elements 70 are mounted on the projection electrodes 11 of the first common main power source plate 10 via the first thermal buffers 60, so that the first main electrodes 710 of the semiconductor elements 70 are electrically connected to the first common main power source plate 10. Further, the second common pair power source plate 90 is arranged on the semiconductor elements 70 via the second thermal buffer 80, and the second main electrodes 712 of the semiconductor elements 70 are electrically connected to the second common main power source plate 90. In short, the semiconductor elements 70 are sandwiched between and electrically connected to the first and second common main power source plates 10 and 90. The control signal is sent to the control electrodes 711 of the semiconductor elements 70 via a gate lead 15L of the gate terminal 15R, control signal wiring layers 321 and 323 of the common control signal/main current plate 30, and the control probes 37. The main current is supplied to the first main electrodes 710 of the semiconductor elements 70 via the main current route constituted by the projection electrodes 11 of the first common main power source plate 10 and the first thermal buffers 60, and via the supplementary main current route constituted by the conductive connectors 40, conductive elastic members 45, and main current wiring layers 320, 322 and 324 of the common control signal/main current plate 30.

In the press-contact type semiconductor device 1, the common control signal/main current plate 30 comprising the main current wiring layers 320, 322 and 324 is provided between the first common main power source plate 10 and the first main electrodes 710 of the semiconductor elements 70. This is effective in reducing the inductance in the circuit between the first main electrodes 710 and control electrodes 711. Further, the common control signal/main current plate 30 comprises the control signal wiring layers 321 and 323 as well as the main current wiring layers 320, 322 and 324, which is effective in improving mutual inductance effects and reducing the inductance.

The conductive connectors 40 and conductive elastic members 45 are provided in the press-contact type semiconductor device 1. At least the main current wiring layer 320 of the common control signal/main current plate 30 is electrically connected to the first common main power source plate 10 at a plurality of points using the conductive connectors 40, which is effective in reducing the inductance. The conductive elastic members 45 stabilize the electrical connection between the main current wiring layer 324 and the conductive connectors 40. Therefore, the common control signal/main current plate 30 can be reliably assembled to the first common main power source plate 10.

The conductive connectors 40 are the screws which can easily and reliably attach the common control signal/main current plate 30 to the first common main power source plate 10. The conductive elastic members 45 are the washers which assist the conductive connectors 40 to electrically and reliably connect in the pressed state the common control signal/main current plate 30 and the first common main power source plate 10.

At least the control signal wiring layer 323 of the common control signal/main current plate 30 is electrically and easily connected to the control electrodes 711 of the semiconductor elements 70 using the control electrode probes 37, which assures ease of assembly of the press-contact type semiconductor device 1.

First Modified Example of Press-Contact Type Semiconductor Device

In a first modified example of the press-contact type semiconductor device 1, the first common main power source plate 10 and the common control signal/main current plate 30 are connected by a structure different from that of the foregoing first embodiment.

Figure 7:
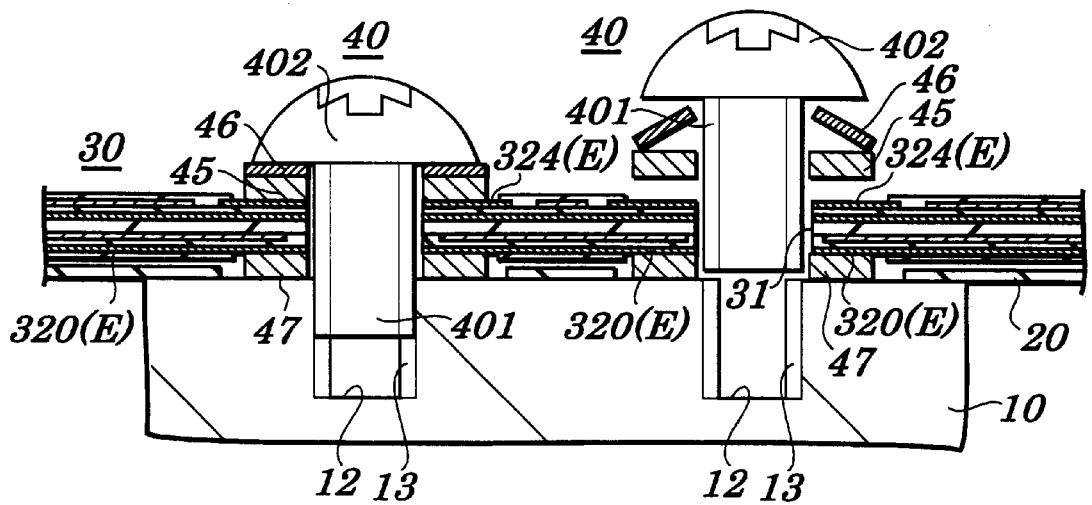
FIG. 7 is an enlarged cross section of first modified examples of the conductive connector and conductive elastic member according to the first embodiment.
Figure 8:
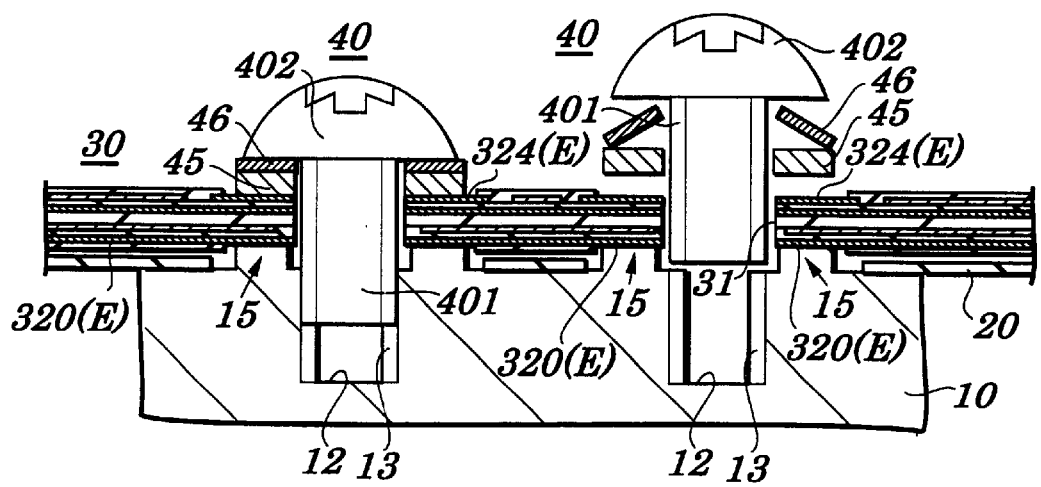
FIG. 8 is an enlarged cross section of second modified examples of the conductive connector and conductive elastic member according to the first embodiment.

Referring to FIG. 7, third conductive elastic members 46 are provided between the conductive elastic members 45 and the conductive connectors 40 on the main current wiring layer 324 in order to electrically connect the conductive elastic members 45 and conductive connectors 40. Further, second conductive elastic members 47 are provided in order to electrically connect the main current wiring layer 320 of the common control signal/main current plate 30 and the first common main power source plate 10. The press-contact type semiconductor device 1 of this modified example is identical to that of the first embodiment in the other respects.

The third conductive elastic members 46 are coned disc springs made of conductive metal materials which are identical to those of the conductive elastic members 45. The third conductive elastic members 46 are effective in improving reliable electrical connections between the main current wiring layer 324 and the conductive connectors 40. The third conductive elastic members 46 are not always indispensable in the first modified example.

The second conductive elastic members 47 may be metal washers similarly to the conductive elastic members 45, and are used to constitute an additional main current route for directly and electrically connecting the main current wiring layer 320 to the first common main power source plate 10 in addition to the main current route via the conductive connectors 40. This is effective in further reducing the inductance. Each of the second conductive elastic members 47 is preferably as thick as or slightly thicker than the insulator 20 provided between the first common main power source plate 10 and the common control signal/main current plate 30 taking allowance into consideration.

In order to efficiently assemble the press-contact type semiconductor device 1, the conductive elastic members 45 and the second conductive elastic members 47 may be attached on the common control signal/main current plate 30 using a solder or the like beforehand. Thereafter, the common control signal/main current plate 30 may be mounted on the first common main power source plate 10 using the third conductive elastic members 46 and conductive connectors 40.

In this modified example, the second conductive elastic members 47 constitute the main current route between the first common main power source plate 10 and the main current wiring layer 320 of the common control signal/main current plate 30, which is effective in further reducing the inductance.

Second Modified Example of Press-Contact Type Semiconductor Device

In a press-contact type semiconductor device 1 of this example, the first common main power source plate 10 comprises protruding connectors 15 in place of the second conductive elastic members 47 of the first modified example, in order to electrically connect to the main current wiring layer 320 of the common control signal/main current plate 30. The protruding connectors 15 are integral with the first common main power source plate 10, and are made of the same material as that of the first common main power source plate 10.

The press-contact type semiconductor device 1 of the second modified example is as effective as that of the first modified example.

Second Embodiment of the Invention

In this embodiment, a press-contact type semiconductor device 1 uses a different structure in order to connect the first common main power source plate 10 and the common control signal/main current plate 30.

Figure 9:
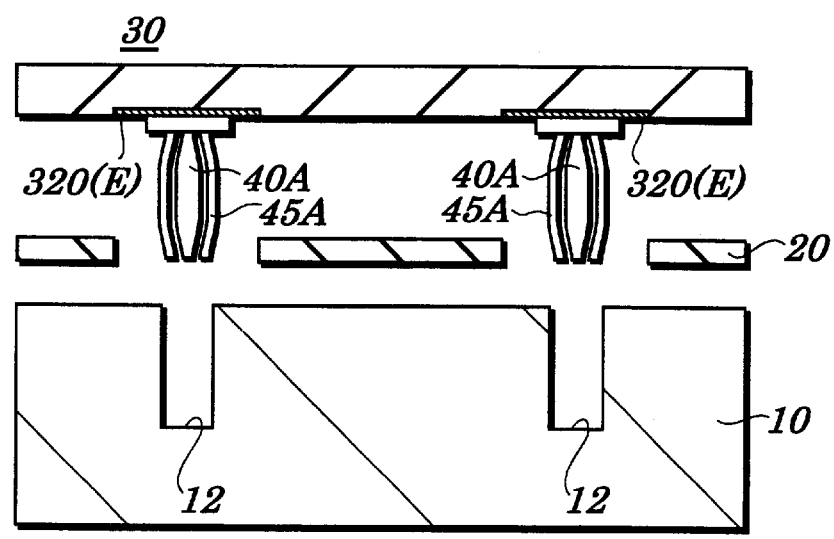
FIG. 9 is an enlarged cross section of a conductive connector and a conductive elastic member of a press-contact type semiconductor device according to a second embodiment of the invention.

Referring to FIG. 9, the structure comprises at least not only conductive connectors 40A for electrically connecting at least the main current wiring layers 320, 322 and 324 of the common control signal/main current plate 30 to the first common main power source plate 10 but also conductive elastic members 45A for electrically connecting at least the main current wiring board 320 to the first common main power source plate 10 by elasticity. The press-contact type semiconductor device 1 of the second embodiment is identical to that of the first embodiment in the other respects.

The conductive connectors 40A are provided on the common control signal/main current plate 30, are in the shape of a rod, and are used to attach the common control signal/main current plate 30 to the first common main power source plate 10. The conductive connectors 40 are preferably T-shaped pins or the like, and are electrically connected at least to the main current wiring layer 320 of the common control signal/main current plate 30, using a bonding metal (e.g. a solder or the like). One end (lower end in FIG. 9) of each conductive connector 40A is fitted into each hole 12 on the first common main power source plate 10 with some clearance. The conductive connectors 40A are made of a metal material identical to that of the conductive connectors 40 in the first embodiment.

The conductive elastic members 45A are electrically connected at least to the main current wiring layer 320 of the common control signal/main current plate 30, and are banana plugs positioned between the conductive connectors 40A and the first common main power source plate 10 (specifically the inner surfaces of the holes 12). The banana plugs are in the shape of a banana, and are laterally resilient. The conductive elastic members 45A are fitted into the holes 12 with the conductive connectors 40A, retaining the conductive connectors 40A in the holes 12, and establishing an electric connection between the conductive connectors 40A and the first common main power source plate 10. The conductive elastic members 45A are preferably made of the same metal material as that of the conductive connectors 45 in the first embodiment.

The press-contact type semiconductor device 1 of this embodiment is as effective as that of the first embodiment. The banana plugs used as the conductive elastic members 45A can electrically and reliably connect the conductive connectors 40A to the common control signal/main current plate 30 in a pressed state compared with the screws used as the conductive elastic members. This is effective in reducing the inductance and improving ease of assembly of the press-contact type semiconductor device 1.

The holes 12 on the first common main power source plate 10 are larger than the conductive connectors 40A, and receive the conductive connectors 40A therein with an appropriate clearance. Therefore, the common control signal/main current plate 30 can be easily positioned on the first common main power source plate 10. Further, the conductive elastic members 45A assure reliable positioning of the common control signal/main current plate 30 on the first common main power source plate 10. Therefore, the second embodiment provides the press-contact type semiconductor device 1 which is easy to assemble and can electrically and reliably connect the first common main power source plate 10 and the common control signal/main current plate 30.

First Modified Example of Press-Contact Type Semiconductor Device

In a first modified example of the press-contact type semiconductor device 1, the common control signal/main current plate 30 is electrically connected to the first common main power source plate 10 using a different structure.

Figure 10:
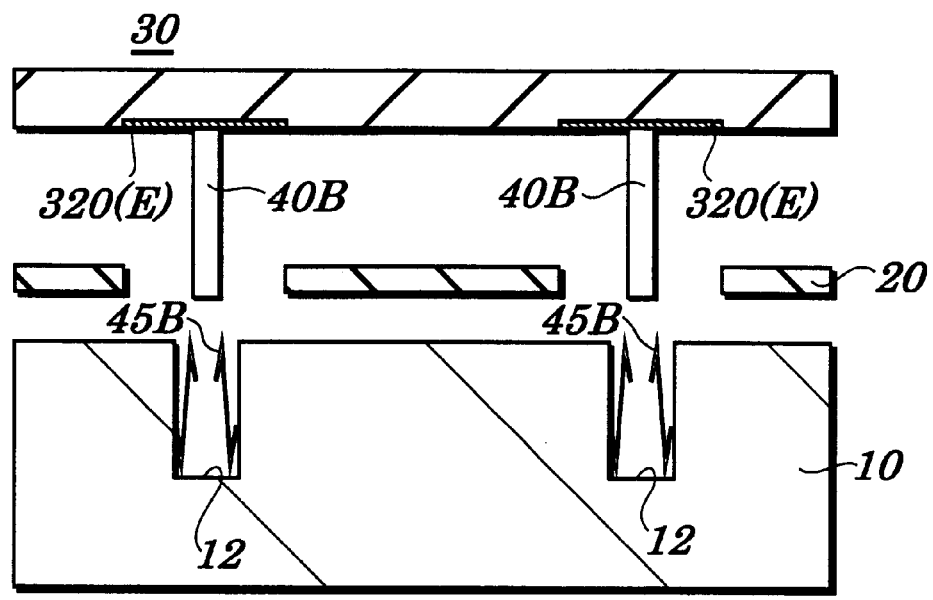
FIG. 10 is an enlarged cross section of first modified examples of the conductive connector and conductive elastic member according to the second embodiment.

Referring to FIG. 10, the press-contact type semiconductor device 1 comprises conductive connectors 40B and conductive elastic members 45B. The conductive connectors 40B are used to electrically connect the main current wiring layers 320, 322 and 324 to the first common main power source plate 10. The conductive elastic members 45B electrically connect the conductive connectors 40B and the first common main power source plate 10 by elasticity. This press-contact type semiconductor device 1 is identical to the press-contact type semiconductor device 1 of the second embodiment in the other respects.

The conductive connectors 40B are in the shape of a rod, or preferably are I-shaped pins, and are attached to the common control signal/main current plate 30. The conductive connectors 40B are designed so as to be fitted into through-holes of the common control signal/main current plate 30, and are electrically connected to the main current wiring layer 320. The through-holes are used to constitute through-hole wirings 330 and so on. If necessary, the conductive connectors 40B may be connected to the main current wiring layer 320 using a solder or the like. The conductive connectors 40B have lower ends (shown in FIG. 10) fitted into the holes 12 on the first common main power source plate 10 with an appropriate clearance. The conductive connectors 40B are made of the metal material same as that of the conductive connectors 40A of the second embodiment, for example.

The conductive elastic members 45B are provided in the holes 12, are made of a sheet spring, and are positioned between the first common main power source plate 10 and the conductive connectors 40B. When the conductive connectors 40B are fitted into the holes 12, the conductive elastic members 45B resiliently hold them and electrically connect them to the first common main power source plate 10. The conductive elastic members 45B are preferably made of the same metal material as that of the conductive elastic members 45A of the second embodiment.

The conductive elastic members 45B are not always made of sheet springs, but may be banana plugs, for example, similarly to the conductive elastic members 45A of the second embodiment.

The press-contact type semiconductor device 1 of the first modified example is as effective as the press-contact type semiconductor device 1 of the second embodiment.

Second Modified Example of Press-Contact Type Semiconductor Device

Figure 11:
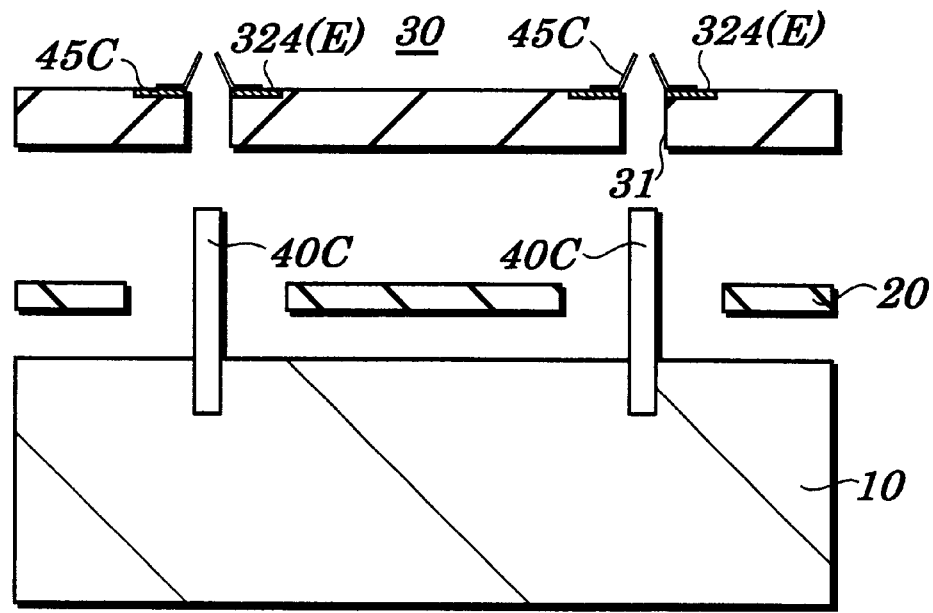
FIG. 11 is an enlarged cross section of second modified examples of the conductive connector and conductive elastic member according to the second embodiment.
Figure 12:
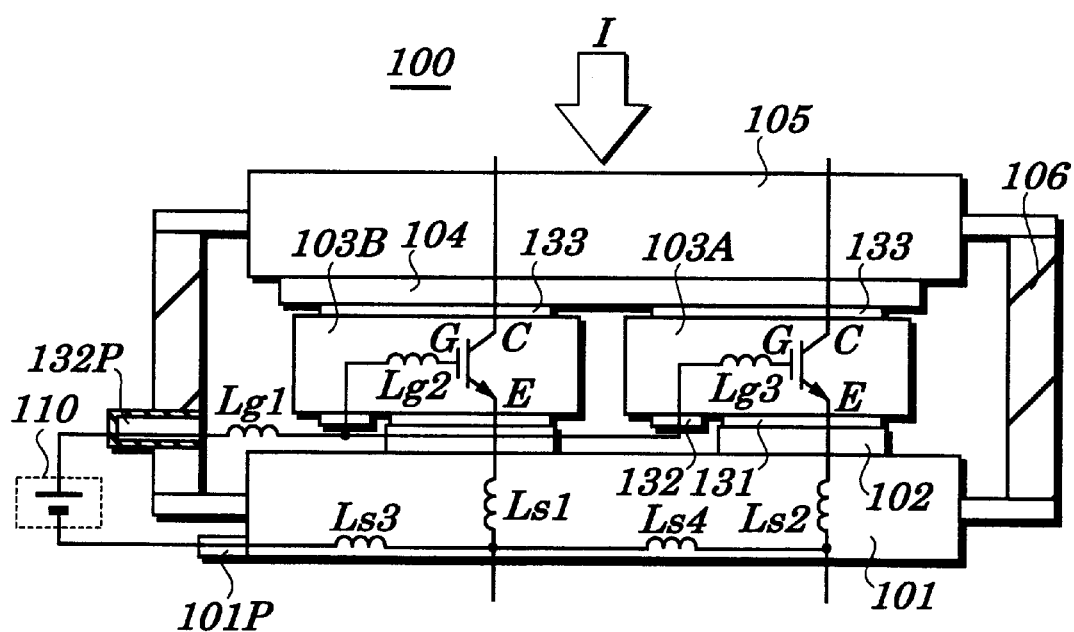
FIG. 12 schematically shows the structure of a press-contact type semiconductor device of the related art.

Referring to FIG. 11, a press-contact type semiconductor device 1 comprises at least conductive connectors 40C and conductive elastic members 45C. The conductive connectors 40C are used to electrically connect the main current wiring layers 320, 322 and 324 of the common control signal/main current plate 30 and the first common main power source plate 10. The conductive elastic members 45C electrically connect the common control signal/main current plate 30 and the conductive connectors 40C by elasticity. This press-contact type semiconductor device 1 is identical to the press-contact type semiconductor device 1 of the second embodiment in the other respects.

The conductive connectors 40C are rods or preferably I-shaped pins to be attached to the first common main power source plate 10, and connect the common control signal/main current plate 30 thereto. The conductive connectors 40C have upper ends (shown in FIG. 11) electrically connected to the main current wiring layer 324 of the common control signal/main current plate 30. Specifically, the conductive connectors 40C are fitted into the first common main power source plate 10, are electrically connected thereto, and are made of the same metal material as that of the conductive connectors 40A of the second embodiment.

The conductive elastic members 45C are sheet springs which are electrically and mechanically attached on the main current wiring layer 324 by a solder or the like. The conductive connectors 40C are fitted to the conductive elastic members 45C via through-holes 31 in the common control signal/main current plate 30. As a result, the conductive connectors 40C hold the common control signal/main current plate 30 by elasticity, so that the main current wiring layer 324 is electrically connected to the first common main power source plate 10. The conductive elastic members 45C are preferably made of the same material as that of the conductive elastic members 45A of the second embodiment.

The press-contact type semiconductor device 1 of the second modified example is as effective as the press-contact type semiconductor device 1 of the second embodiment.

Other Embodiments of the Invention

In the foregoing embodiments, each press-contact type semiconductor device 1 comprises the common control signal/main current plate 30 constituted by the main current wiring layers 320, 322 and 324, and the control signal wiring layers 321 and 323. Alternatively, the press-contact type semiconductor device 1 may include a common control signal/main current plate 30 constituted by a single main current wiring layer and a single control signal wiring layer which are provided on an insulator. Further, a common control signal/main current plate 30 may have four or more main current wiring layers and three or more control signal wiring layers.

The insulators 310 and so on of the common control signal/main current plate 30 are made of a glass epoxy resin. Alternatively, they may be heat-resistant, flexible and soft sheets or films made of a polyimide resin or the like.

The semiconductor elements 70 are not always required to be IGBTs. Alternatively, they may be MOSFETs (metal oxide semiconductor field effect transistors), SITs (static induction transistors), BJTs (bipolar transistors), SI (static induction) thyristors, GTO thyristors, IEGTs (injection enhanced gate transistors) or the like. In the case of the SI or GTO thyristor, a first main electrode is either an anode or cathode region. In the case of the BJT, the first main electrode is either an emitter or collector region. In the case of the MOSFET or SIT, the first main electrode is either a source or drain region. Further, a second main electrode is either the anode or cathode region which does not function as the first main electrode in the SI or GTO thyristor. The second main electrode is either the emitter or collector region which does not function as the first main electrode in the BJT. In the MOSFET or SIT, the second main electrode is either the source or drain region which does not function as the first main electrode. In other words, when the anode region functions as the first main electrode in the SI or GTO thyristor, the cathode region functions as the second main electrode. When the emitter region functions as the first main electrode in the BJT, the collector region functions as the second main electrode. When the source region functions as the first main electrode in the MOSFET and SIT, the drain region functions as the second main electrode. Further, in the case of the MOSFET and SIT, a control electrode is a gate electrode. In the case of BJT, the control electrode is a base electrode.

Further, the press-contact type semiconductor device 1, and especially the first and second common main power source plates 10 do not have to be in the shape of a disc. Alternatively, they may be square, rectangular, pentagon or polygonal.

Although the invention has been described with respect to some embodiments thereof, it will be understood by those skilled in the art that various alterations and modifications are possible without departing from the spirit of the present invention.

What is claimed is:

1. A press-contact type semiconductor device comprising:
    a plurality of semiconductor elements each of which has a first main electrode and a control electrode on a front surface thereof and a second main electrode on a rear surface thereof;
    a second common main power source plate having said semiconductor elements positioned on a front surface thereof and electrically connected to said second main electrodes of said semiconductor elements;
    a first common main power source plate arranged on said front surfaces of said semiconductor elements and electrically connected to said first main electrodes of said semiconductor elements;
    a common control signal/main current plate arranged between semiconductor elements and comprising at least control signal wiring layers electrically connected to said control electrodes and main current wiring layers electrically connected to said first main electrodes;
    conductive connectors for electrically connecting at least said main current wiring layers and said first common main power source plate; and
    conductive elastic members configured to connect electrically said main current wiring layers or said first common main power source plate to said conductive connectors by elasticity.

2. The press-contact type semiconductor device of claim 1, wherein said common control signal/main current plate is constituted by a wiring substrate in which at least said control signal wiring layers and said main current wiring layers are laid one over after another via insulating layers.

3. The press-contact type semiconductor device of claim 2, wherein both of said control wiring layers and said main current wiring layers of said common control signal/main current plate are multiple-layered.

4. The press-contact type semiconductor device of claim 3, wherein a plurality of said multiple-layered control wiring layers and a plurality of said multiple-layered main current wiring layers of said common control signal/main current plate are alternately laid over one after another, and said main current wiring layers are positioned opposite to said control signal wiring layers.

5. The press-contact type semiconductor device of claim 1, wherein said common control signal/main current plate further comprises a resistance element which is integral to either said control signal wiring layers or said main current wiring layers.

6. The press-contact type semiconductor device of claim 1, wherein said common control signal/main current plate is in the shape of a mesh and has an electrode openings configured to connect said first common main power supply plate and said semiconductor elements.

7. The press-contact type semiconductor device of claim 2, wherein said conductive connectors and said conductive elastic members comprise a multiple contact structure.

8. The press-contact type semiconductor device of claim 2, wherein said conductive connectors are attached to said common control signal/main current plate using a bonding metal.

9. The press-contact type semiconductor device of claim 2, wherein each of said conductive connector is a screw configured to attach said common control signal/main current plate to said first common main power source plate, and each of said conductive elastic members is a washer interposed between said conductive connector and said common control signal/main current plate.

10. The press-contact type semiconductor device of claim 2, wherein each of said conductive connector is a screw configured to attach said common control signal/main current plate to said first common main power source plate, and each of said conductive elastic members is a coned disc spring interposed between said conductive connector and said common control signal/main current plate.

11. The press-contact type semiconductor device of claim 9 further comprising second conductive elastic members which are interposed between said common control signal/ main current plate and said first common main power source plate, and electrically connect said main current wiring layers and said first common main power source plate by elasticity.

12. The press-contact type semiconductor device of claim 9, wherein said first main power source plate comprises projection connectors electrically connected to said main current wiring layers.

13. The press-contact type semiconductor device of claim 2, wherein each of said conductive connectors is in the shape of a rod, is provided on said common control signal/main current plate and attaches said common control signal/main current plate to said first common main power source plate, and each of said conductive elastic member is a banana plug interposed between said conductive connector and said first common main power source plate.

14. The press-contact type semiconductor device of claim 13, wherein each of said conductive rod connectors is a T-shaped or I-shaped pin.

15. The press-contact type semiconductor device of claim 2, wherein each of said conductive connectors is in the shape of a rod, is provided on said common control signal/main current plate and attaches said common control signal/main current plate to said first common main power source plate, and each of said conductive elastic members is a sheet spring interposed between said conductive connector and said first common main power source plate.

16. The press-contact type semiconductor device of claim 15, wherein each of said conductive rod connectors is a T-shaped or I-shaped pin.

17. The press-contact type semiconductor device of claim 1 further comprising control electrode probes configured to connect electrically said control signal wiring layers of the common control signal/main current plate to said control electrodes of said semiconductor element.

18. The press-contact type semiconductor device of claim 17, wherein each of said control electrode probes comprises: a cylinder; a substrate contacting part on a bottom of said cylinder; a elastic member positioned in said cylinder; a piston movable in said cylinder; and an element contacting part at an upper part of said piston.

19. The press-contact type semiconductor device of claim 18, wherein said substrate contacting part and said element contacting part of said control electrode probes are semi-spherical.

20. The press-contact type semiconductor device of claim 18, wherein said substrate contacting parts of said control electrode probes are electrically contacted to said control signal wiring layers of said common control signal/main current plate, and said element contact parts of said control electrode probes are electrically contacted to said control electrodes of said semiconductor elements.

* * * * *